United States Patent
Efros et al.

(10) Patent No.: US 8,394,651 B2
(45) Date of Patent: Mar. 12, 2013

(54) AUGER RATE SUPPRESSION IN CONFINED STRUCTURES

(75) Inventors: Alexander L. Efros, Annandale, VA (US); George E. Cragg, Washington, DC (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 450 days.

(21) Appl. No.: 12/644,011

(22) Filed: Dec. 22, 2009

(65) Prior Publication Data

US 2011/0147699 A1 Jun. 23, 2011

(51) Int. Cl.
  *H01L 21/00* (2006.01)
  *H01L 29/06* (2006.01)
(52) U.S. Cl. .......................... 438/20; 257/10
(58) Field of Classification Search .............. 438/20, 438/22, 48; 257/9–11
  See application file for complete search history.

(56) References Cited

U.S. PATENT DOCUMENTS

| | | | |
|---|---|---|---|
| 5,615,558 A * | 4/1997 | Cornell et al. | 62/56 |
| 7,515,333 B1 * | 4/2009 | Empedocles | 359/344 |
| 2009/0109435 A1 | 4/2009 | Kahen et al. | |

FOREIGN PATENT DOCUMENTS

WO  WO 2009/120688  10/2009

OTHER PUBLICATIONS

Cragg et al, "Suppression of Auger Processes in Confined Structures," NANO Letters, pp. 313-331, dated Oct. 27, 2009.*
Wang et al, "Non-blinking semiconductor nanocrystals," Nature, vol. 459, pp. 686-689, dated Jun. 4, 2009.*
Cragg et al., "Suppression of Auger Processes in Confined Structures," Nano Lett., 2010, 10, 313-317.
Wang et al., "Non-blinking semiconductor nanocrystals," Nature, 2009, 459, 686-689.

* cited by examiner

*Primary Examiner* — Calvin Lee
(74) *Attorney, Agent, or Firm* — Amy Ressing; Rebecca Forman

(57) ABSTRACT

The present invention is generally directed to a method of suppressing the Auger rate in confined structures, comprising replacing an abrupt confinement potential with either a smooth confinement potential or a confinement potential of a certain size found by increasing the confinement potential width until the Auger recombination rate undergoes strong oscillations and establishes a periodic minima. In addition, the present invention provides for the design of structures with high quantum efficiency.

8 Claims, 3 Drawing Sheets a)

b)

AUGER RATE SUPPRESSION IN CONFINED STRUCTURES

BACKGROUND OF THE INVENTION

1. Field of the Invention

The present invention relates generally to optical devices (elements) and, more specifically, to the design of devices based on low-dimensional semiconductor structures.

2. Description of the Prior Art

Typically, quantum wells, quantum wires, and quantum dots (confined semiconductor structures) have abrupt interfaces that confine the electron and holes within. This abrupt confinement contributes to non-radiative Auger processes that severely limit the quantum efficiency of quantum well based devices (e.g., semiconductor lasers, light emitting diodes, semiconductor optical amplifiers, biological markers, etc.).

In the early sixties, the one-dimensional carrier confinement achieved in semiconductor quantum wells and superlattices brought about a revolution in solid-state device technology. To fulfill the requirements of miniaturization, low power consumption, and fast operational speed, further efforts of carrier confinement in two and in three dimensions were realized with the advent of quantum wires and quantum dots. However, the application of nanostructures to real world devices has been strongly curtailed by the enhancement of dissipative Auger processes which undergird all aspects of carrier relaxation and recombination. In particular, Auger processes have been attributed to the decrease of the photoluminescence quantum efficiency in light emitting diodes, an increase in the stimulated emission threshold in lasers, and the photoluminescence degradation and photoluminescence blinking in nanocrystal (NC) quantum dots. These detrimental effects were initially explained through other mechanisms since bulk wide-gap semiconductors have negligible Auger rates due to a temperature threshold proportional to their energy gap. Eventually, it was realized that the temperature threshold was not present because, unlike the requirement in the bulk case, Auger recombination in confined structures does not require a carrier with kinetic energy comparable to the energy gap. This explained why Auger processes are very efficient in confined structures, even those fabricated from wide-gap semiconductors.

Most impressively, Auger processes are visually manifest in the random intermittency observed in studies of the photoluminescence (PL) intensity emitted from a single NC. Even under constant illumination, all colloidal nanocrystals grown today exhibit this emission intermittency which has consequently been dubbed "photoluminescence blinking." First observed about twelve years ago, the intermittency of the photoluminescence intensity came as a complete surprise in a study of a single CdSe under steady-state excitation conditions. Since then, many others have observed this effect at various temperatures in many other types of nanocrystals and nanowires. Today, the consensus is that the blinking occurs because, when illuminated, NCs can be charged (or ionized), and subsequently neutralized. Optical excitation of a neutral NC excites an electron-hole pair, which then recombines giving rise to the PL. However, if the NC is charged, the extra carrier triggers a process known as non-radiative Auger recombination during which the exciton energy is acquired by the extra charging electron or hole (see FIG. 1). Because the rate of Auger recombination is orders of magnitude faster than the rate of radiative recombination, photoluminescence is completely suppressed, or "quenched," in charged NCs.

BRIEF SUMMARY OF THE INVENTION

The aforementioned problems are overcome in the present invention which provides a method to suppress the Auger rate in confined structures of optical devices, comprising replacing an abrupt hole confinement potential with either a smooth confinement profile or a confinement profile of a certain size found by increasing the confinement potential width until the Auger recombination rate undergoes strong oscillations and establishes a periodic minima. In addition, the present invention provides for the design of structures with high quantum efficiency.

Current methods pertain to abruptly confined structures that have a large Auger rate rendering them relatively inefficient light sources (i.e., they have a relatively low ratio of output energy to pump energy). In the present invention, smoothly confined structures have reduced Auger rates, making them much more efficient than the sharply confined structures. An object of this invention is to increase the photoluminescent efficiency of active optical elements. Possible applications include, but are not limited to, designing efficient semiconductor lasers (decreasing the lasing threshold), light emitting diodes, semiconductor optical amplifiers, and the design of non-blinking biological markers. An example of non-blinking semiconductor nanocrystals can be found in Wang et al., "Non-blinking Semiconductor Nanocrystals," Nature, 459, 686-689 (2009), the entire contents of which are incorporated herein by reference.

These and other features and advantages of the invention, as well as the invention itself, will become better understood by reference to the following detailed description, appended claims, and accompanying drawings.

BRIEF DESCRIPTION OF THE DRAWINGS

FIG. 1(a) depicts a neutral structure in which photo-excited electron-hole pair recombines then radiatively emits light. If the structure acquires a positive charge, for example, then the excitation energy of the electron-hole pair is transferred to the extra hole. In this nonradiative Auger recombination process, the remnant hole will either be ejected into the continuum (shown as a sinusoidal wave) (FIG. 1(b)) or it will remain bound inside the nanostructure should the confinement be sufficiently deep (FIG. 1(c)). Analogously, Auger processes lead to carrier excitation in the continuum (FIG. 1(d)) or a bound level (FIG. 1(e)) even in the case of multiple excitons. Similar figures can be displayed for the case where the extra charge is an electron instead of a hole.

FIG. 3(a) is a confinement profile having a 1 nm core, a shell width of $w_1$ and a shell depth $h_1$. FIGS. 3(b)-(g) are a series of plots of the Auger rate dependence on shell thickness in decreasing increments of $h_1$: in FIG. 3(b), $h_1=150$ meV; in FIG. 3(c), $h_1=140$ meV; in FIG. 3(d), $h_1=130$ meV; in FIG. 3(e), $h_1=120$ meV; in FIG. 3(f), $h_1=110$ meV; and in FIG. 3(g), $h_1=100$ meV. The general trend indicates that adding an outer shell effectively suppresses the even peaks in the Auger rate. Maximal suppression of the second peak occurs for $h_1$=110 to 120 meV and an outer shell thickness of approximately 0.7 nm.

DETAILED DESCRIPTION OF THE INVENTION

Figure 1:
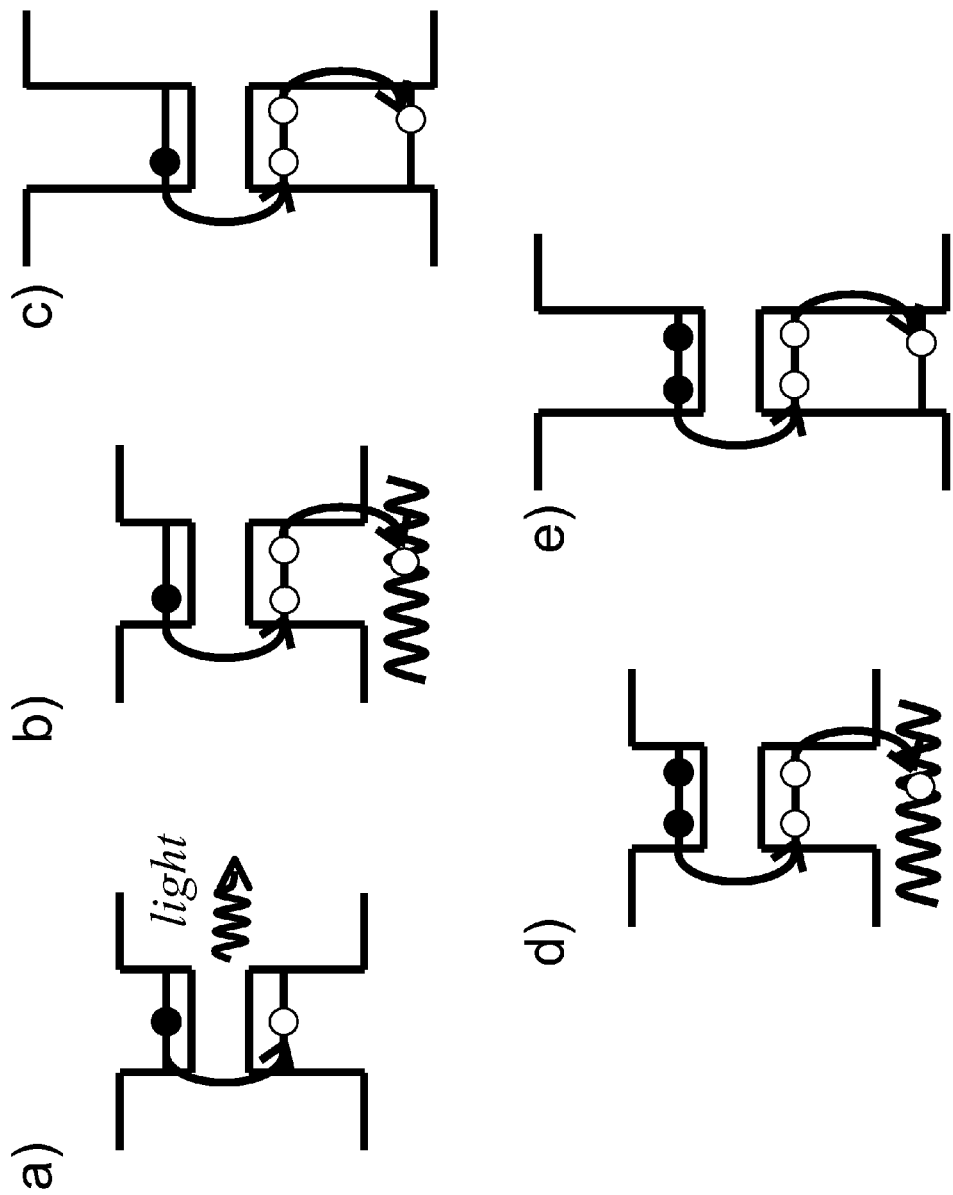
FIG. 1 is a schematic diagram of various recombination processes of photo-excited electron-hold pairs.

The present invention generally relates to suppressing the nonradiative Auger decay rate in confined structures. By calculating the efficiency of Auger processes in low dimensional heterostructures that confine the free motion of the carriers, it is shown that the enhanced efficiency of Auger processes is due to the abruptness of the heterointerfaces or bounding surfaces. Therefore, the present invention discloses suppressing Auger efficiency by creating structures with a soft confinement potential. Calculations conducted in the two-band, effective mass Kane model show that smoothing out the confinement potential may reduce the rate by at least three orders of magnitude relative to the rate in structures with abruptly terminating boundaries.

The rate of noradative Auger recombination can be calculated using Fermi's Golden Rule. Because highly excited final states are short-lived relative to the Auger transition time, Fermi's Rule provides a valid description of the Auger rate for a final hole state that either is bound or that resides in the continuum.

When calculating the Auger rate, a major problem is encountered when obtaining an accurate estimation of the transition matrix element. After the Auger process, the extra carrier acquires a large momentum as a result of the transfer of the photoexcitation energy. Consequently, the corresponding wave function becomes rapidly oscillating within the confined volume, resulting in a matrix element that is much smaller than the average Coulomb interaction energy. Integration of the smooth ground state with the rapidly oscillating final state causes the relative diminution in the transition matrix element.

From the Fourier expansion of the ground state, the leading contribution to the transition matrix element is given by the spatial frequency component, which matches the large momentum of electrons or holes in the excited final state, $kF \approx kf$. In heterostructures, the large kF is usually generated by abrupt interfaces or surfaces. At large $kF=kf \gg 1/a$, the Fourier component corresponding to the abrupt confinement potential is exponentially larger than that associated with a smooth parabolic profile. Hence, the abruptness of a confinement potential significantly increases the transition matrix element, thus accelerating the rate of Auger processes. This qualitative analysis suggests that Auger processes can be significantly suppressed in low-dimensional structures with a soft confinement potential.

Moreover, Auger processes become quenched at certain sizes of the confinement potential width due to destructive interference between the initial and the final states. As the confinement potential width is increased, the calculated rate decreases overall, exhibiting very deep minima at regular widths. Such minima suggest the size of nanocrystals for which nonradiative Auger processes are strongly suppressed.

In Cragg et al., "Suppression of Auger Processes in Confined Structures," Nano Letters, December 2009, the entire contents of which are incorporated by reference, the inventors investigated how confinement potential shape affects the rate of nonradiative Auger processes. If the excited carrier has sufficient energy to enter the continuum, the Auger rate is proportional to the square of Fourier amplitude of the initial, ground state evaluated at the spatial frequency of the final, excited state. Reducing the high spatial frequency components in the ground states by smoothing out the confinement decreases the Auger rate by about three orders of magnitude in comparison to an abrupt potential.

Figure 2:
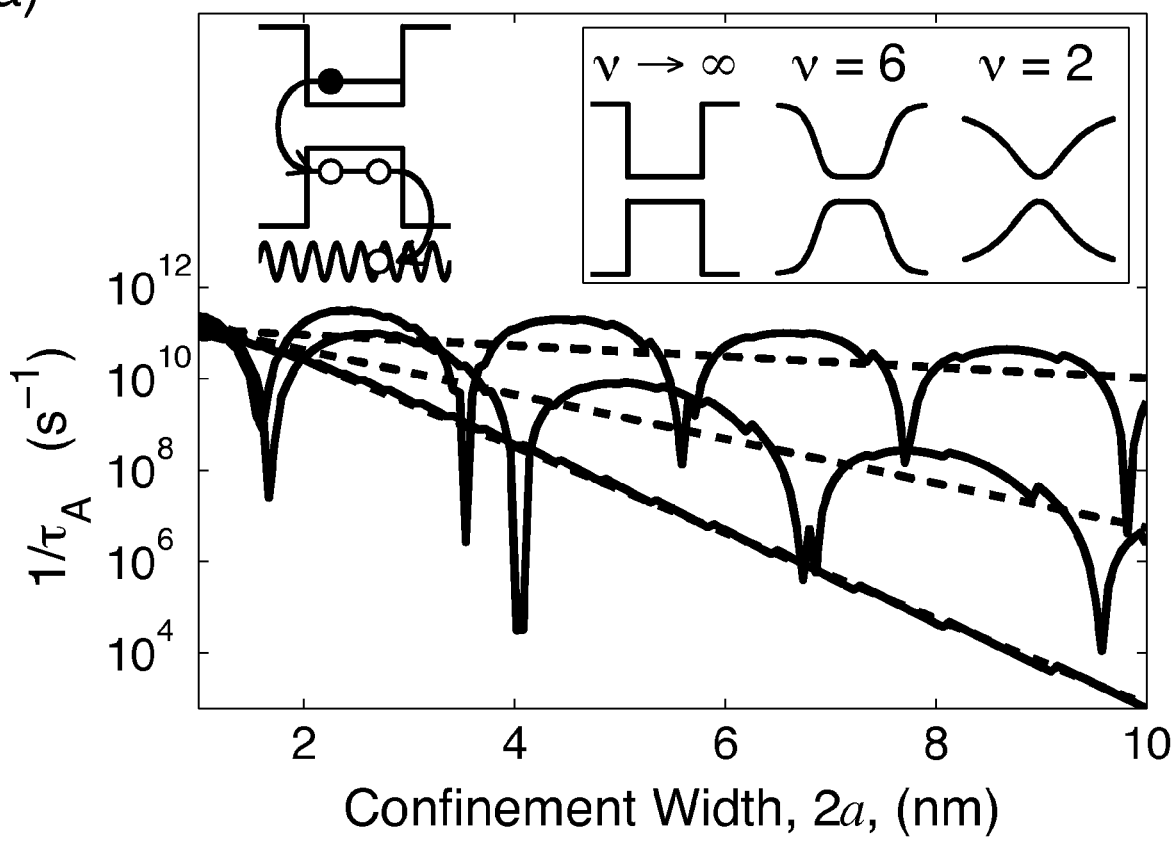
FIG. 2(a) is a semilog plot of the Auger recombination rate as a function of the confinement potential width, $2a$, for the case where the hole is ejected into the continuum (upper left). As shown in the inset, the three traces correspond to three confinement profiles, each with a fixed height of 300 meV. Accompanying dashed lines are best fits to the dependencies in the least squares sense. The Auger rate displays a successive reduction as the confinement profile is smoothed.
FIG. 2(b) is a semilog plot of the Auger recombination rate versus the confinement height calculated for the same confinement profiles, all having a fixed width of $2\alpha=3$ nm. All quantities used are typical for AlGaInAs/InP quantum wells.
Figure 2:
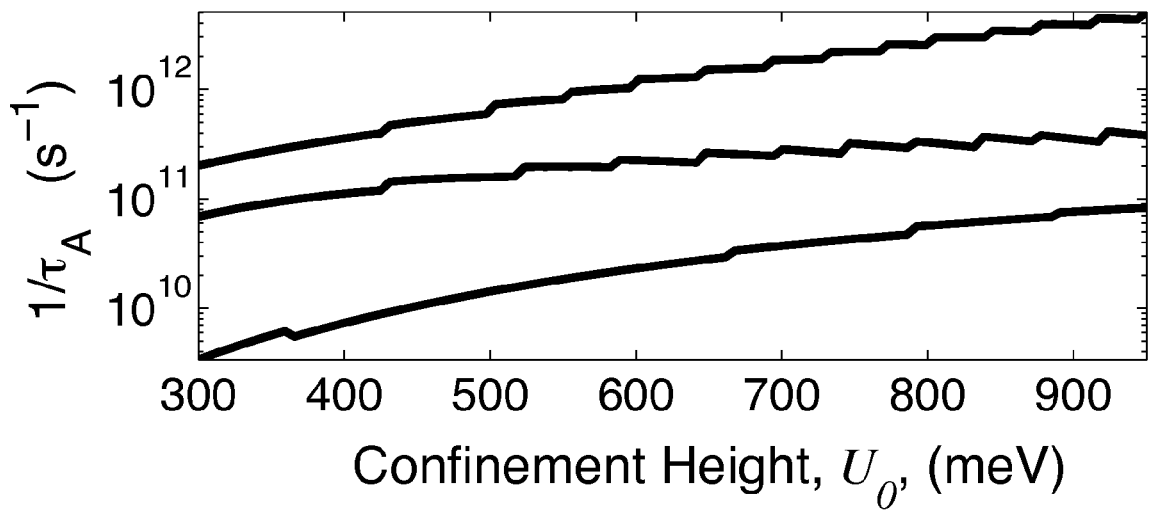
Figure 3:
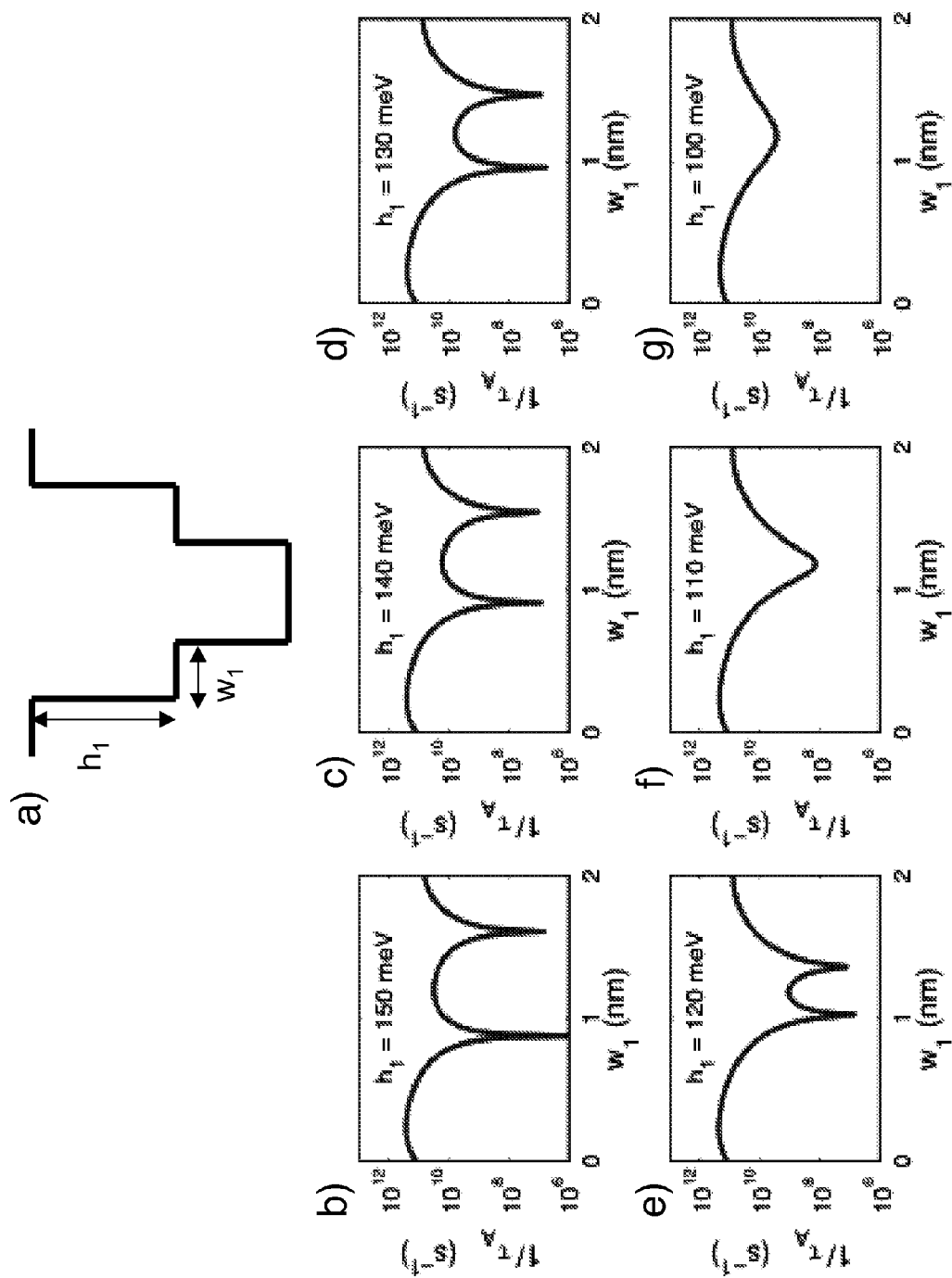
FIG. 3 is a scheme for Auger rate reduction using multiple abrupt transitions in the carrier confinement potentials.

In addition to smooth profiles, it may be possible to exploit the periodic nature of the Auger rate as the well width is increased. The periodic minima shown in FIG. 2(d) may be enhanced by using a core-shell type structure as shown in FIG. 3. The confined structure may be a layered structure having a core and at least one cladding layer. As described in Cragg et al., "Suppression of Auger Processes in Confined Structures," Nano Letters, December 2009, the Auger recombination rate undergoes strong oscillations as the confinement width is increased. This can allow fabrication of NC having certain sizes that exhibit significant Auger recombination rate suppression. Such approaches can be utilized in engineering non-blinking nanocrystals for use in biological and optoelectronic applications requiring high quantum efficiency. Softening the confinement potential can also be used for engineering tunable, low threshold lasers and LEDs with high quantum yields based on quantum wells and quantum wires of wide gap semiconductors.

The above descriptions are those of the preferred embodiments of the invention. Various modifications and variations are possible in light of the above teachings without departing from the spirit and broader aspects of the invention. It is therefore to be understood that the claimed invention may be practiced otherwise than as specifically described. Any references to claim elements in the singular, for example, using the articles "a," "an," "the," or "said," is not to be construed as limiting the element to the singular.

What is claimed as new and desired to be protected by Letters Patent of the United States is:

1. A method to suppress the Auger rate in confined structures, comprising using the size of electron and hole confinement potential found by increasing the confinement potential width until the Auger recombination rate undergoes strong oscillations and establishes a periodic minima.

2. The method of claim 1, wherein the confined structure is a layered structure comprising a core and at least one cladding layer.

3. A method to suppress the Auger rate in confined structures, comprising replacing an electron and hole confinement potential having an abrupt step profile with an electron and hole confinement potential with a soft transition profile wherein the Fourier high spatial frequency components are reduced in the ground state.

4. The method of claim 3, wherein the soft transition profile is parabolic.

5. The method of claim 3, wherein the soft transition profile comprises a core-shell structure.

6. A method to suppress the Auger rate in confined structures, comprising
   replacing an electron and hole confinement potential having an abrupt step profile with an electron and hole confinement potential with a soft transition profile wherein the Fourier high spatial frequency components are reduced in the ground state and
   using the size of electron and hole confinement potential found by increasing the confinement potential width until the Auger recombination rate undergoes strong oscillations and establishes a periodic minima.

7. The method of claim 6, wherein the soft transition profile is parabolic.

8. The method of claim 6, wherein the confined structure is a layered structure comprising a core and at least one cladding layer.

* * * * *